United States Patent [19]

Snyder

[11] Patent Number: 4,775,844
[45] Date of Patent: Oct. 4, 1988

[54] BRIDGE AMPLIFIER TOPOLOGY

[76] Inventor: William Snyder, Rte. 113a, North Sandwich, N.H. 03259

[21] Appl. No.: 85,842

[22] Filed: Oct. 13, 1987

[51] Int. Cl.[4] .......................... H02H 7/20; H03F 3/26
[52] U.S. Cl. .................................... 330/298; 330/146; 330/207 P
[58] Field of Search .................... 330/146, 202, 207 P, 330/263, 297, 298

[56] References Cited

U.S. PATENT DOCUMENTS

| | | | |
|---|---|---|---|
| 2,590,104 | 3/1952 | King | 330/72 |
| 3,808,545 | 4/1974 | Stanley | 330/265 |
| 4,023,074 | 5/1977 | Fichtner | 330/207 P X |
| 4,117,415 | 9/1978 | Hoover | 330/264 |
| 4,229,706 | 10/1980 | Bongiorno | 330/297 X |
| 4,611,180 | 9/1986 | Stanley | 330/298 |

OTHER PUBLICATIONS

"Constant-Current Operation of Power Amplifiers", H. Sterling, Journal of the Audio Engineering Society, Jan. 1953.
"Audio Amplifier Matches Voice Coil Impedance", K. Onder, Electronics, Feb. 1954.

Primary Examiner—Eugene R. LaRoche
Assistant Examiner—Steven J. Mottola

[57] ABSTRACT

A class A bridge topology for audio amplifiers configured to operate in constant current mode, comprising power stages (3,4,5,6) supplied by supplies (8,9) and driven to equal amplitude opposite phase output signals applied across a load (7). Symmetrical current conditions are placed on said power stages to achieve a cancellation of supply currents during signal application to the load. Supplies are current limited to afford non-intrusive protection against overstress.

1 Claim, 1 Drawing Sheet

U.S. Patent    Oct. 4, 1988    4,775,844
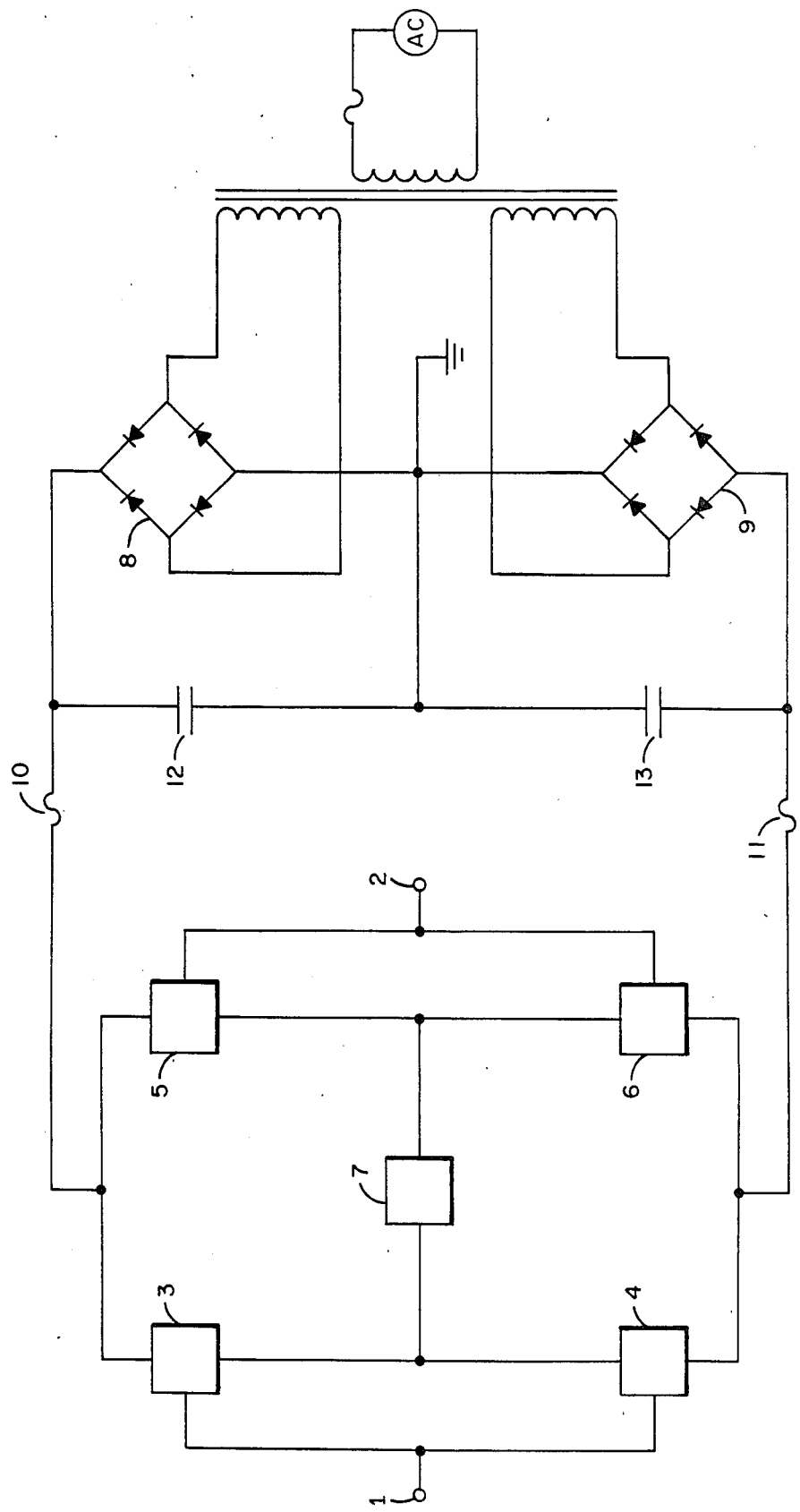

BRIDGE AMPLIFIER TOPOLOGY

BACKGROUND

1. Field of Invention

This invention relates to amplifier circuits, specifically to those with constant current output stages.

2. Description of Prior Art

Class A transistor amplifiers are well known in the art. Traditionally, class A bias is used to eliminate switching distortion and stabilize device parameters against changes in temperature and load impedance. It has been established that variations in supply voltage due to load current degrade the signal quality of such amplifiers. Load currents can temporarily pull the supply voltage down, thereby changing device operating points and causing distortion. In single supply multichannel amplifiers load transients can couple to other channels causing crosstalk. Additionaly, high frequency interstage coupling can cause oscillation due to unpredicted feedback paths.

Output devices and loads are usually protected against overstress caused by a transient signal or load condition. The design goal of such protection is to prevent overstress failures without degrading signal quality during normal operation.

Heretofore, attempts to minimize the effects of supply voltage variations due to load current in transistor audio amplifiers include the use of increased filter capacitance and inductance, additional transformer power, active regulation, and separate supplies for different stages and channels. Prior vacuum tube art includes several constant current audio amplifier topologies. In these non-bridge designs the alternating current drawn from the supply was reduced, but with a loss of efficiency. Vacuum tube bridge topologies were used to eliminate the output transformer. The constant current technique did not survive the transition to solid state amplifier designs where the normally used class AB bias precludes constant current operation.

Methods to protect output devices and loads usually involve active current limiting, relays, or fuses in the signal circuitry. Prior art protection topologies generally have some effect on signal quality. Protection circuitry requirements are more restrictive when more energy is stored in the supply, creating a design conflict between overstress protection and sound quality.

Since the above methods to solve two conflicting design problems require the addition of extra components that increase amplifier cost and weight, a need exists for a new approach, thus the alternate solution below.

OBJECTS AND ADVANTAGES

Accordingly, it is an object of the present invention to provide an improved class A amplifier topology.

It is another object of the invention to reduce the need for alternating current power supply filtering in class A amplifiers.

It is another object of the invention to ease the requirements for direct current regulation in class A amplifiers.

It is another object of the invention to eliminate the need for separate supplies in multistage or multichannel amplifiers.

It is another object of the invention to eliminate signal intrusive overstress protection.

Further objects and advantages of the invention will become apparent from the consideration of the FIGURE and ensuing description.

DRAWING FIGURE

The FIGURE shows a block diagram of one embodiment of the invention.

OPERATION

In the FIGURE a signal is converted to two equal amplitude opposite phase signals applied to inputs 1 and 2. If the sum of the currents through stages 3 and 4 is a constant quantity, and the sum of currents through stages 5 and 6 is a constant quantity, independent of load current, then a symmetrical current output stage condition is established. The class A complementary symmetrical current output stages 3,4,5,6 generate a voltage across load 7. Summing the idle current through each half of the bridge network gives the total supply current. A change in current draw from the supply by stage 3 is offset by an equal and opposite change by stage 5. Similarly, changes in the supply current of stages 4 and 6 cancel. Constant current operation is thus realized.

Power supplies 8 and 9 need only provide an unchanging direct current during normal operation, and are limited to no more than this current by the use of power limiting transformers, active current limiting, or fuses. The sonic effects of these current limiting methods are eliminated by the constant current condition. With a signal present, the supply impedance does not cause supply voltage variations. Protection is accomplished by supply current limiting and by the use of loads and active devices that can withstand the supply current limit.

The symmetrical current condition for each side of the bridge is very nearly true for many transistor or tube circuits known in the art, such as a complementary, common collector configuration.

It is clear that with the bridge class A topology described, a constant current condition is achieved, providing the following advantages: power supply restrictions are lessened, interstage and interchannel isolation is improved, and output overstress protection is less intrusive. By using the constant current topology with supply current limiting one can construct an amplifier that has the attributes of an infinite supply reserve, but can withstand a continous short circuit across a normally full signal output. Additionally, amplifier cost and weight are reduced.

Although the above description contains many specifics, it should not be construed as limiting the scope of the invention, but rather as an example of one embodiment thereof. Many other variations are possible. Accordingly, the scope of the invention should be determined not by the embodiment illustrated, but by the appended claims and its legal equivalent.

I claim:

1. A bridge amplifier comprising:
   two equivalent power amplifier sections;
   a load connected across said sections to form a bridge circuit;
   said power amplifier sections powered by a common source of supply at each pair of corresponding supply terminals to form a constant current bridge;
   each said power amplifier section configured to draw a quiescent direct current greater than the peak current change at each said supply terminal during signal application to said load in normal operation;
   circuitry provided between said supply terminals and each said supply source that limits current delivered to said power amplifier sections to a value marginally greater that required for quiescent operation.

* * * * *